United States Patent
Zhang et al.

(10) Patent No.: US 11,996,288 B2
(45) Date of Patent: May 28, 2024

(54) GALLIUM OXIDE FILM BASED ON SAPPHIRE SUBSTRATE AS WELL AS GROWTH METHOD AND APPLICATION THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Xiaodong Zhang, Suzhou (CN); Yaming Fan, Suzhou (CN); Baoshun Zhang, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 828 days.

(21) Appl. No.: 17/051,779

(22) PCT Filed: Oct. 8, 2018

(86) PCT No.: PCT/CN2018/109317
§ 371 (c)(1),
(2) Date: Oct. 30, 2020

(87) PCT Pub. No.: WO2019/218581
PCT Pub. Date: Nov. 21, 2019

(65) Prior Publication Data
US 2021/0327703 A1    Oct. 21, 2021

(30) Foreign Application Priority Data
May 18, 2018  (CN) .......................... 201810479225.8

(51) Int. Cl.
H01L 21/02    (2006.01)
C23C 16/40    (2006.01)
(Continued)

(52) U.S. Cl.
CPC .......... H01L 21/0262 (2013.01); C23C 16/40 (2013.01); C30B 25/183 (2013.01);
(Continued)

(58) Field of Classification Search
CPC ............. H01L 21/0262; H01L 21/0242; H01L 21/02483; H01L 21/02565; H01L 21/0251;
(Continued)

(56) References Cited

U.S. PATENT DOCUMENTS

2014/0103339 A1*  4/2014 Yamazaki ........... H01L 21/0262
257/43

FOREIGN PATENT DOCUMENTS

CN    101921994 A  * 12/2010
CN    101921994 A    12/2010

OTHER PUBLICATIONS

Lee, S. A. et al., Journal of the Korean Physical Society, 47)2005), S292-S295 (Year: 2005).*

(Continued)

*Primary Examiner* — Michael G Miller
(74) *Attorney, Agent, or Firm* — Bayramoglu Law Offices LLC

(57) ABSTRACT

The disclosure provides a gallium oxide film based on sapphire substrate as well as a growth method and an application thereof. The gallium oxide film based on sapphire substrate is prepared by a method below, including: forming more than one $\alpha\text{-}(Al_xGa_{1-x})_2O_3$ strain buffering layers on the sapphire substrate by means of pulsed epitaxial growth, wherein $0.99 \geq x \geq 0.01$; and forming gallium oxide epitaxial layers on the $\alpha\text{-}(Al_xGa_{1-x})_2O_3$ strain buffering layers. The growth method provided can not only avoid the technical difficulty of contradictory epitaxial temperatures of $\alpha\text{-}Ga_2O_3$ and $\alpha\text{-}Al_2O_3$, but also effectively reduce the (Continued)

defect density of $\alpha$-Ga$_2$O$_3$ epitaxial film, thus further improving the crystal quality of the $\alpha$-Ga$_2$O$_3$ epitaxial film materials.

21 Claims, 2 Drawing Sheets

(51) Int. Cl.
 *C30B 25/18* (2006.01)
 *C30B 29/16* (2006.01)
(52) U.S. Cl.
 CPC .......... *C30B 29/16* (2013.01); *H01L 21/0242* (2013.01); *H01L 21/02483* (2013.01); *H01L 21/02565* (2013.01)
(58) Field of Classification Search
 CPC ... H01L 21/02505; H01L 33/00; H01L 33/32; H01L 33/48; H01L 33/005; C23C 16/40; C23C 16/45523; C30B 25/183; C30B 29/16; C30B 25/165
 See application file for complete search history.

(56) References Cited

OTHER PUBLICATIONS

Machine translation, CN 101921994 (Year: 2010).*
Oda, M. et al., Japanese Journal of Applied Physics, 55, 1202B4 (Year: 2016).*
Sang-A Lee et al., Metal/Insulator/Semiconductor Structure Using Ga2O3 Layer by Plasma Enhanced Atomic Layer Deposition, Journal of the Korean Physical Society, Sep. 2005, pp. S292-S295, vol. 47.
Masaya Oda et al., Crack-free thick (~5 μm) $\alpha$-Ga2 O3 films on sapphire substrates with $\alpha$-(Al,Ga)2 O3 buffer layers, Japanese Journal of Applied Physics 55, 2016, pp. 1-5, 1202B4.

* cited by examiner

GALLIUM OXIDE FILM BASED ON SAPPHIRE SUBSTRATE AS WELL AS GROWTH METHOD AND APPLICATION THEREOF

CROSS REFERENCE TO THE RELATED APPLICATIONS

This application is the national phase entry of International Application No. PCT/CN2018/109317, filed on Oct. 8, 2018, which is based upon and claims priority to Chinese Patent Application No. 201810479225.8, filed on May 18, 2018, the entire contents of which are incorporated herein by reference.

TECHNICAL FIELD

The disclosure relates to a growth method of semiconductor materials, specifically relates to a gallium oxide film based on a sapphire substrate as well as a growth method thereof, which belong to the field of semiconductor technology and electronic technology.

BACKGROUND

Semiconductor materials play an irreplaceable role in modern information industrial society and are the cornerstone of modern semiconductor industry and microelectronics industry. With the development of various advanced technologies, the demand for high performance electronic devices such as high voltage, high power and radiation resistance and deep ultraviolet photoelectronic devices is becoming more and more urgent. Especially in the high voltage and deep ultraviolet fields, traditional semiconductor materials have been difficult to meet the requirements of use.

Compared with the third generation of semiconductor materials, such as gallium nitride (GaN) and silicon carbide (SiC), the ultra-wide bandgap oxide semiconductor-gallium oxide ($Ga_2O_3$) has the advantages of a greater band gap, a higher breakdown field strength, transparent and conductive, being formed by a melt growth method, and a lower cost, which has become the research focus in the field of semiconductor materials and devices.

There are totally five known crystalline phases $\alpha$, $\beta$, $\gamma$, $\delta$, $\varepsilon$ for the $Ga_2O_3$ material, wherein $\beta$-$Ga_2O_3$ (Eg=4.7 to 4.9 eV) has the most stable structure and can interconvert with the other four gallium oxides. However, $\alpha$-$Ga_2O_3$ may have a band gap up to 5.3 eV, which can effectively improve the voltage resistance of the devices. The mobility of $\alpha$-$Ga_2O_3$ material is also higher than that of $\beta$-$Ga_2O_3$, so the performances of the devices may be superior to those of $\beta$-$Ga_2O_3$. Moreover, $\alpha$-$Ga_2O_3$ has the advantages of good chemical stability, thermal stability and large breakdown field strength, thus having broad application prospects in the fields of deep ultraviolet transparent conductive films, ultraviolet detectors, semiconductor power devices, spin-electron devices, gas sensors and the like.

At present, common preparation methods of $\alpha$-$Ga_2O_3$ materials include various chemical vapor deposition (CVD) processes, such as MOCVD, LPCVD, Mist-CVD and the like, molecular beam epitaxy (MBE), halide vapor phase epitaxy (HVPE), atomic layer deposition (ALD) and the like.

$\alpha$-$Ga_2O_3$ belongs to the trigonal system, R3c space group (the lattice constants are: a=b=4.98 Å, c=13.43 Å, $\alpha=\beta=90°$, $\gamma=120°$, the thermal expansion coefficient $\alpha=5.23\times10^{-6}$/° C.). The c-plane sapphire ($\alpha$-$Al_2O_3$, a=b=4.76 Å, c=13.43 Å, $\alpha=\beta=90°$, $\gamma=120°$, $\alpha=5.22\times10^{-6}$/° C.) has the same crystal structure as that of $\alpha$-$Ga_2O_3$, both being corundum structures, which is suitable as the heteroepitaxy substrate for $\alpha$-$Ga_2O_3$. It has been reported currently that high quality $\alpha$-$Ga_2O_3$ can be grown on the sapphire substrate by using a Mist-chemical vapor deposition process (Mist-CVD), and the performances of the prepared Schottky diodes (SBD) are superior to those of SiC SBD. Therefore, $\alpha$-$Ga_2O_3$ materials and devices can be prepared in large scale and at low costs by employing cheap sapphire substrates and a CVD growth technology.

Although $\alpha$-$Ga_2O_3$ and $\alpha$-$Al_2O_3$ have the same crystal structures, the differences of lattice constants and thermal conductivities cause a certain degree of mismatch in epitaxy, which results in an increased dislocation of $\alpha$-$Ga_2O_3$ and cracking of the film, thus seriously affecting the application of materials and the development of devices.

SUMMARY

The main purpose of the disclosure is to provide gallium oxide film based on a sapphire substrate as well as a growth method and an application thereof, to overcome the defects in the prior art.

To achieve the above purpose, the disclosure employs the following technical schemes, including:

An embodiment of the disclosure provides a preparation method of a gallium oxide film based on a sapphire substrate, including:

Forming more than one $\alpha$-$(Al_xGa_{1-x})_2O_3$ strain buffering layers on the sapphire substrate by means of pulsed epitaxial growth, wherein $0.99 \geq x \geq 0.01$; and Forming gallium oxide epitaxial layers on the $\alpha$-$(Al_xGa_{1-x})_2O_3$ strain buffering layers.

An embodiment of the disclosure further provides a gallium oxide film based on a sapphire substrate prepared by the above preparation method.

An embodiment of the disclosure further provides a gallium oxide film based on a sapphire substrate, including a sapphire substrate and a gallium oxide epitaxial layer, there are more than one $\alpha$-$(Al_xGa_{1-x})_2O_3$ strain buffering layers further formed between the sapphire substrate and the gallium oxide epitaxial layer, wherein $0.99 \geq x \geq 0.01$.

An embodiment of the disclosure further provides an application of the gallium oxide film based on the sapphire substrate in the field of the production of semiconductor power devices and semiconductor photoelectronic devices.

Compared with the prior art, $\alpha$-$(Al_xGa_{1-x})_2O_3$ strain buffering layers can be formed by the growth method provided in the embodiments of the disclosure, which can not only avoid the technical difficulty of contradictory epitaxial temperatures of $\alpha$-$Ga_2O_3$ and $\alpha$-$Al_2O_3$, but also effectively reduce the defect density of $\alpha$-$Ga_2O_3$ epitaxial film, thus further improving the crystal quality of the $\alpha$-$Ga_2O_3$ epitaxial film materials.

DETAILED DESCRIPTION OF THE EMBODIMENTS

Figure 1:
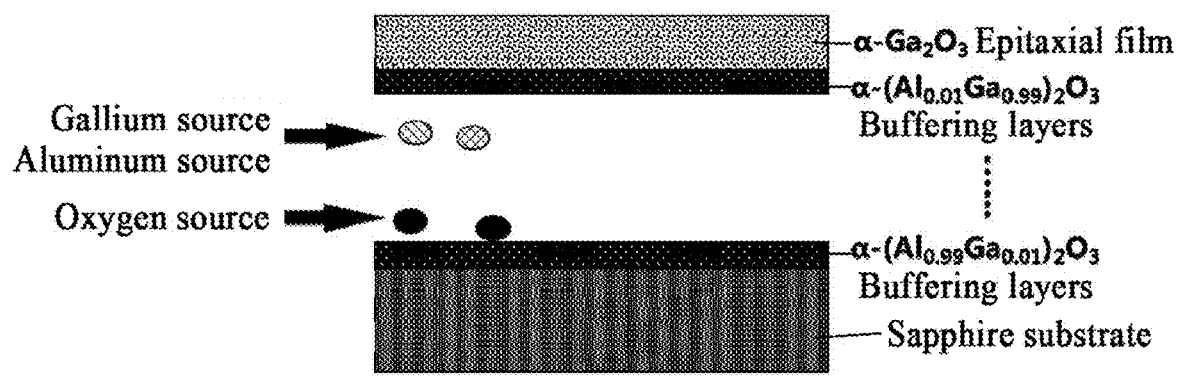
FIG. 1 is the structural representation of a gallium oxide film based on a sapphire substrate according to an exemplary embodiment of the disclosure.

In view of the deficiencies in the prior art, the present inventor has tried to employ a pulsed epitaxy method to grow a structure of $\alpha\text{-}(Al_xGa_{1-x})_2O_3$ strain buffering layers containing different amounts of Al components at low temperature, so as to alleviate the $\alpha\text{-}Ga_2O_3$ film strain, reduce the dislocation density of the epitaxial film, and improve the quality of $\alpha\text{-}Ga_2O_3$ crystals. However, on one hand, $Al_2O_3$ has a smaller bond-length and a higher decomposition temperature compared with $Ga_2O_3$, so the epitaxy of $\alpha\text{-}Al_2O_3$ also requires a higher temperature. The quality of $\alpha\text{-}(Al_xGa_{1-x})_2O_3$ crystals is affected by the physical and chemical absorption capacities of Al atoms on the surface of the epitaxial layer, the mobility capacities and the abilities to be incorporated into the crystal lattice as well as the desorption temperature and the like. On the other hand, the epitaxy of $\alpha\text{-}Ga_2O_3$ requires low temperature, and the phase transition would occur above 550° C. This results in that it is difficult to grow $\alpha\text{-}(Al_xGa_{1-x})_2O_3$ strain buffering layers containing a high amount of Al components below this temperature. That is, if the above solution which has been attempted by the inventor is employed, the contradictory problem of the epitaxial temperatures of $\alpha\text{-}Ga_2O_3$ and $\alpha\text{-}Al_2O_3$ will be unavoidable.

For this, a long time of research and a great deal of practices have been further conducted by the present inventor to propose the technical scheme of the disclosure, in which a pulsed epitaxy method is mainly employed to grow a composite strain buffering structure of $\alpha\text{-}(Al_xGa_{1-x})_2O_3$ at low temperature to solve the problem in the existing technology.

An embodiment of the disclosure provides a preparation method of a gallium oxide film based on a sapphire substrate, including: Forming more than one $\alpha\text{-}(Al_xGa_{1-x})_2O_3$ strain buffering layers on the sapphire substrate by means of pulsed epitaxial growth, wherein $0.99 \geq x \geq 0.01$; and Forming gallium oxide epitaxial layers on the $\alpha\text{-}(Al_xGa_{1-x})_2O_3$ strain buffering layers.

Further, the preparation method includes: placing the sapphire substrate into a reaction chamber, then feeding an oxygen source, a gallium source and/or an aluminum source into the reaction chamber separately at different time by means of pulse to form the more than one $\alpha\text{-}(Al_xGa_{1-x})_2O_3$ strain buffering layers.

Furthermore, the preparation method specifically includes: in each growth cycle, any one of the oxygen source, the gallium source and/or the aluminum source is firstly fed into the reaction chamber continuously for a first time period, then an interval of a second time period, then another one of the oxygen source, the gallium source and/or the aluminum source is fed into the reaction chamber continuously for a third time period, and then an interval of a fourth time period.

Further, the first time period, the second time period, the third time period, and the fourth time period each has a duration of 0.1 to 99 s.

Further, the oxygen source is selected from oxygen-containing substances which are capable of supplying oxygen element.

Preferably, the oxygen-containing substances includes any one or a combination of two or more of oxygen gas, water, nitrous oxide, nitric oxide, carbon dioxide and carbon monoxide, but not limited to this.

Further, the gallium source is selected from gallium-containing organic compounds.

Preferably, the gallium source includes trimethyl gallium and/or triethyl gallium, but not limited to this.

Further, the aluminum source is selected from aluminum-containing organic compounds.

Preferably, the aluminum source includes trimethyl aluminum and/or triethyl aluminum, but not limited to this.

Further, for the $\alpha\text{-}(Al_xGa_{1-x})_2O_3$ strain buffering layers, the growth pressure is 10 to 760 Torr, and the growth temperature is 100 to 1000° C.

Furthermore, the preparation method includes: successively forming 1 to 99 the $\alpha\text{-}(Al_xGa_{1-x})_2O_3$ strain buffering layers on the sapphire substrate.

Furthermore, each of the $\alpha\text{-}(Al_xGa_{1-x})_2O_3$ strain buffering layers has a thickness of 1 to 1000 nm.

Further, at least two $\alpha\text{-}(Al_xGa_{1-x})_2O_3$ layers contain different amounts of Al element.

Further, for the gallium oxide epitaxial layer, the growth pressure is 10 to 760 Torr, and the growth temperature is 100 to 600° C.

Further, the gallium oxide epitaxial layer is made of $\alpha\text{-}Ga_2O_3$.

An embodiment of the disclosure further provides a gallium oxide film based on a sapphire substrate prepared by the above preparation method.

An embodiment of the disclosure further provides a gallium oxide film based on a sapphire substrate, including a sapphire substrate and a gallium oxide epitaxial layer, and there are more than one $\alpha\text{-}(Al_xGa_{1-x})_2O_3$ strain buffering layers further formed between the sapphire substrate and the gallium oxide epitaxial layer, wherein $0.99 \geq x \geq 0.01$.

Further, each $\alpha\text{-}(Al_xGa_{1-x})_2O_3$ layer has a thickness of 1 to 1000 nm.

Further, the gallium oxide film includes 1 to 99 $\alpha\text{-}(Al_xGa_{1-x})_2O_3$ layers.

Further, at least two $\alpha\text{-}(Al_xGa_{1-x})_2O_3$ layers contain different amounts of Al element.

A pulsed epitaxy method is employed in the disclosure to grow a structure of $\alpha\text{-}(Al_xGa_{1-x})_2O_3$ strain buffering layers containing different amounts of Al components at low temperature, which can not only avoid the difficulty of contradictory epitaxial temperatures of $\alpha\text{-}Ga_2O_3$ and $\alpha\text{-}Al_2O_3$, but also effectively reduce the defect density of $\alpha\text{-}Ga_2O_3$ epitaxial film, and alleviate the $\alpha\text{-}Ga_2O_3$ film strain, thus improving the crystal quality of the $\alpha\text{-}Ga_2O_3$ epitaxial film materials.

An embodiment of the disclosure further provides an application of the gallium oxide film based on the sapphire substrate in the production of semiconductor power devices or semiconductor photoelectronic devices.

The implementation process and principle of the technical scheme according to the embodiments of the disclosure are further illustrated below in combination with the embodiments and the accompanying drawings.

With reference to FIG. 1, showing a structural representation of a gallium oxide film based on a sapphire substrate according to an exemplary embodiment of the disclosure, which includes a sapphire substrate, as well as multiple $\alpha\text{-}(Al_xGa_{1-x})_2O_3$ strain buffering layers and one or more $\alpha\text{-}Ga_2O_3$ epitaxial layers successively disposed on the sapphire substrate.

The gallium oxide film based on the sapphire substrate in this embodiment can be prepared by a process including the following steps:

1) A pulsed epitaxy method is employed to grow $\alpha\text{-}(Al_xGa_{1-x})_2O_3$ strain buffering layers on a sapphire substrate at low temperature. The epitaxial growth method may be selected from chemical vapor deposition (CVD), especially metal organic chemical vapor deposition (MOCVD) and the like; the applicable equipment includes CVD (Chemical vapor deposition), LPCVD (Low pressure chemical vapor deposition), MOCVD (Metal organic chemical vapor deposition), MBE (Molecular beam epitaxy), LMBE (Laser molecular beam epitaxy), ALD (Monoatomic layer deposition), PEALD (Plasma enhanced atomic layer deposition), HVPE (Hydride vapor phase epitaxy) and the like.

Figure 2:
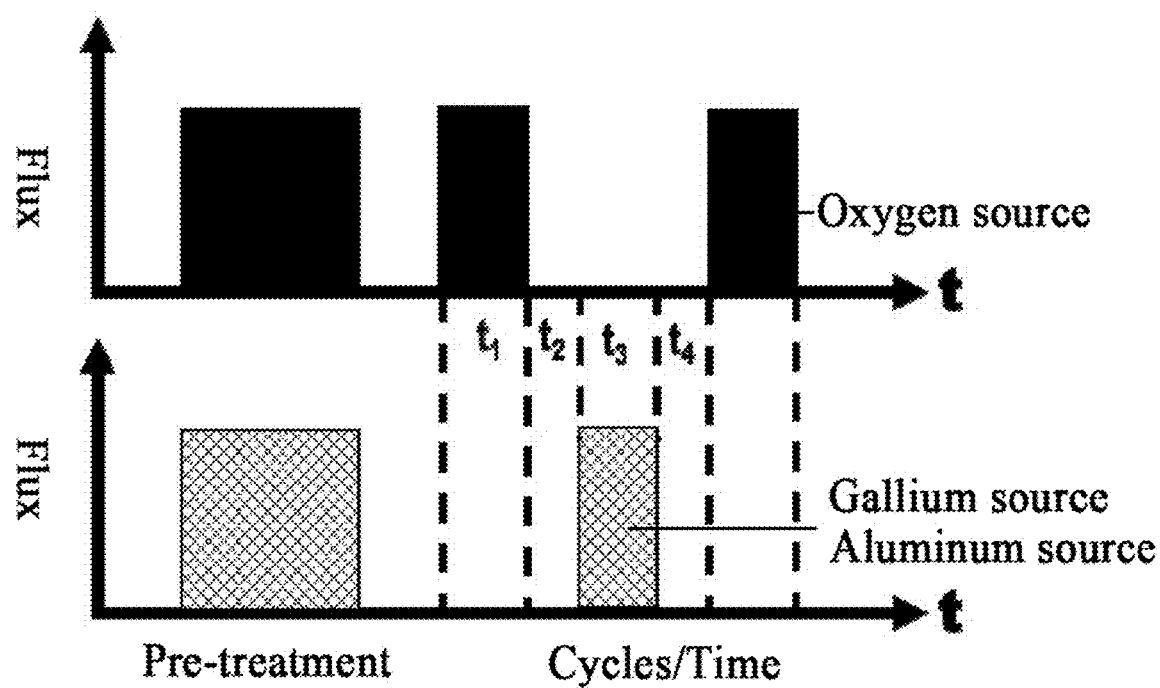
FIG. 2 is a diagram showing the flux of oxygen source and aluminum/gallium source in the pulsed epitaxial growth according to an exemplary embodiment of the disclosure.
Figure 3:
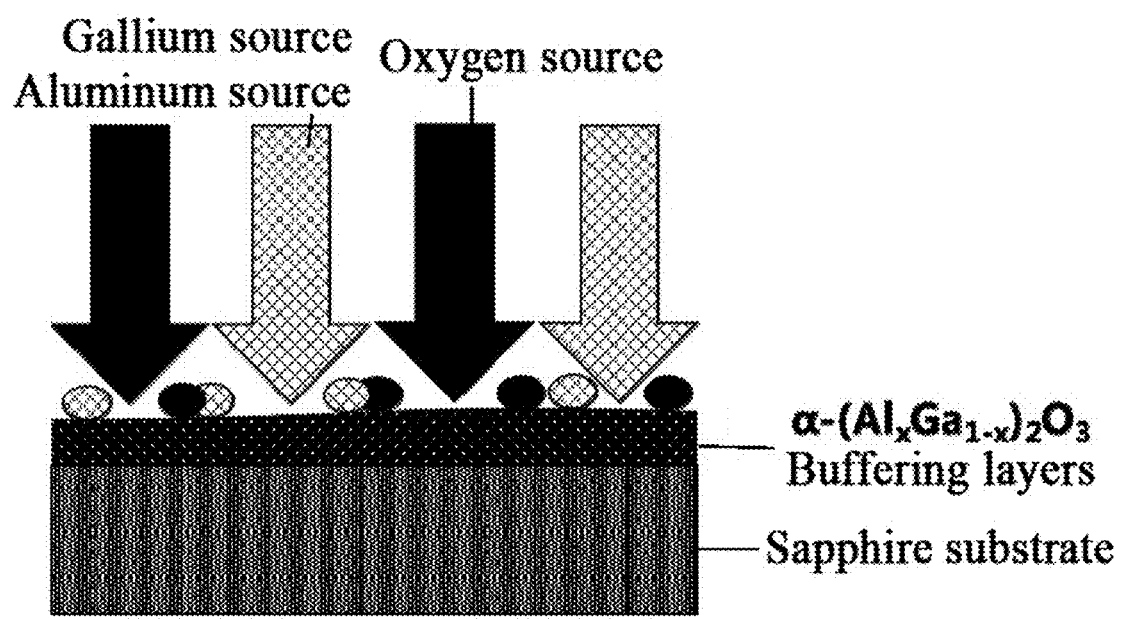
FIG. 3 is a diagram showing the epitaxial growth of $\alpha$-$(Al_xGa_{1-x})_2O_3$ strain buffering layers according to an exemplary embodiment of the disclosure.

In particular, with reference to FIG. 2 and FIG. 3, oxygen source (may be oxygen gas) and gallium/aluminum source (e.g., triethyl gallium/trimethyl gallium) are epitaxial grown periodically by means of pulse separation, that is, in one pulse cycle period ($t_1$, $t_2$, $t_3$, $t_4$ pulse widths represent the following four variables respectively: the time for feeding the oxygen source into the reaction chamber, the interval time, the time for feeding the gallium/aluminum source into the reaction chamber, and the interval time, which are alternating, wherein $0.1 \leq t_1/t_2/t_3/t_4 \leq 99$ s), the number of pulse cycles, the pulse width (corresponding to the time for feeding the oxygen source, the gallium/aluminum source into the reaction chamber) and the number of pulses (corresponding to the number of times the oxygen source, the gallium/aluminum source are fed into the reaction chamber) are monitored and designed flexibly, so as to realize the growth of high-quality $\alpha$-$(Al_xGa_{1-x})_2O_3$ film materials (i.e., the strain buffering layers) at low temperature (that is, allowing the atoms migrate to the optimal position at lower temperature to form bonds, thus realizing the high-quality film epitaxy).

A pulsed epitaxy method is employed to feed an oxygen source and a gallium source/an aluminum source into the reaction chamber separately at different time, which can reduce the chance of pre-reaction between 0 and Al/Ga due to their contact before reaching the substrate, reduce the material defects caused by the precipitation of the pre-reaction products, increase the lateral mobility of Al/Ga atoms on the growth surface, thus allowing Al/Ga—O to react to form bonds at the optimal lattice point on the growth surface, making the binding of $(Al_xGa_{1-x})_2O_3$ more regular, allowing the atoms to be arranged regularly when bound into the crystals and obtaining an atomically smooth surface.

The growth process can be controlled by adjusting the process parameters of pulsed growth such as pulse width, interval, cycles and stacked time, etc., to improve the quality of crystals. Based on the buffering layers containing different amounts of Al component, the strain during the epitaxy can be adjusted and the stress can be released by controlling the temperature and thickness of $(Al_xGa_{1-x})_2O_3$ ($0.99 \geq x \geq 0.01$).

In this embodiment, the oxygen source may be selected from various oxygen-containing substances being capable of generating O molecules, such as oxygen gas, water, nitrous oxide, nitric oxide, carbon dioxide, carbon monoxide, etc.

In this embodiment, the gallium source may be selected from various metal organic sources of Ga, such as trimethyl gallium (TMG), triethyl gallium (TEG); other Ga-containing substances.

In this embodiment, the aluminum source may be selected from various metal organic sources of Al, such as trimethyl aluminum (TMA), triethyl aluminum (TEA); other Al-containing substances.

In this embodiment, for each $\alpha$-$(Al_xGa_{1-x})_2O_3$ strain buffering layer, the pressure for epitaxial growth is preferably controlled at 10 Torr to 760 Torr or higher.

In this embodiment, for each $\alpha$-$(Al_xGa_{1-x})_2O_3$ strain buffering layer, the temperature for epitaxial growth is preferably 100° C. to 1000° C.

In this embodiment, for each $\alpha$-$(Al_xGa_{1-x})_2O_3$ strain buffering layer, the temperature for epitaxial growth is preferably 100° C. to 600° C.

In this embodiment, in each $\alpha$-$(Al_xGa_{1-x})_2O_3$ strain buffering layer, x is preferably selected from the range of $0.99 \geq x \geq 0.01$.

In this embodiment, the number of $\alpha$-$(Al_xGa_{1-x})_2O_3$ strain buffering layers is preferably in the range of $99 \geq$ the number of layers $\geq 1$.

In this embodiment, each $\alpha$-$(Al_xGa_{1-x})_2O_3$ strain buffering layer has a thickness preferably in the range of 1 nm $\geq$ thickness $\geq 1000$ nm.

In this embodiment, the various times in the above pulsed epitaxy ($t_1$, $t_2$, $t_3$, $t_4$) are preferably in the range of $99\,s \geq t \geq 0.1\,s$.

2) Conducting the growth of $\alpha$-$Ga_2O_3$ epitaxial layer

In this embodiment, the growth method of $\alpha$-$Ga_2O_3$ epitaxial layer also may be MOCVD (metal organic chemical vapor deposition) and the like, and the applicable method includes CVD (Chemical vapor deposition), LPCVD (Low pressure chemical vapor deposition), MOCVD (Metal organic chemical vapor deposition), MBE (LMBE) (Molecular beam epitaxy), ALD (PEALD) (Plasma enhanced atomic layer deposition), HVPE (hydride vapor phase epitaxy) and the like.

In this embodiment, the epitaxial growth pressure used in the step 2) is preferably 10 Torr to 760 Torr or higher.

In this embodiment, the growth temperature of the $\alpha$-$Ga_2O_3$ epitaxial layer is preferably 100° C. to 600° C.

The method provided in the embodiments of the disclosure can not only avoid the technical difficulty of contradictory epitaxial temperatures of $\alpha$-$Ga_2O_3$ and $\alpha$-$Al_2O_3$, but also effectively reduce the defect density of $\alpha$-$Ga_2O_3$ epitaxial film, thus obtaining the $\alpha$-$Ga_2O_3$ epitaxial film materials with an ideal quality.

It should be understood that the above embodiments are only intended to illustrate the technical conception and features of the disclosure, and aim to enable persons familiar with the art to understand the content of the disclosure and apply it accordingly, rather than limiting the scope of the disclosure thereby. All equivalent changes or modifications made substantially according to the spirit of the disclosure should be covered within the scope of the disclosure.

What is claimed is:

1. A preparation method of a gallium oxide film based on a sapphire substrate, comprising:
   forming more than one $\alpha$-$(Al_xGa_{1-x})_2O_3$ strain buffering layers on the sapphire substrate by means of pulsed epitaxial growth, wherein $0.99 \geq x \geq 0.01$;
   forming gallium oxide epitaxial layers on the $\alpha$-$(Al_xGa_{1-x})_2O_3$ strain buffering layers, wherein each strain buffering layer comprises aluminum and gallium; and
   placing the sapphire substrate into a reaction chamber, then feeding an oxygen source, a gallium source and an aluminum source into the reaction chamber separately at different times by means of pulse to form the $\alpha$-$(Al_xGa_{1-x})_2O_3$ strain buffering layers.

2. The preparation method according to claim 1, wherein, in a growth cycle for each of the $\alpha$-$(Al_xGa_{1-x})_2O_3$ strain buffering layers, any one of the oxygen source, the gallium source and/or and the aluminum source is firstly fed into the reaction chamber continuously for a first time period, then an interval of a second time period, then another one of the oxygen source, the gallium source and/or the aluminum source is fed into the reaction chamber continuously for a third time period, and then an interval of a fourth time period.

3. The preparation method according to claim 2, wherein: the first time period, the second time period, the third time period, and the fourth time period each has a duration of 0.1 to 99 s.

4. The preparation method according to claim 1, wherein: the oxygen source is selected from oxygen-containing substances.

5. The preparation method according to claim 4, wherein: the oxygen-containing substances comprise any one or a combination of two or more of oxygen gas, water, nitrous oxide, nitric oxide, carbon dioxide and carbon monoxide.

6. The preparation method according to claim 1, wherein: the gallium source is selected from gallium-containing organic compounds.

7. The preparation method according to claim 6, wherein: the gallium source comprises trimethyl gallium and/or triethyl gallium.

8. The preparation method according to claim 1, wherein: the aluminum source is selected from aluminum-containing organic compounds.

9. The preparation method according to claim 8, wherein: the aluminum source comprises trimethyl aluminum and/or triethyl aluminum.

10. The preparation method according to claim 1, wherein: for the forming of the $\alpha\text{-}(Al_xGa_{1-x})_2O_3$ strain buffering layers, a growth pressure is 10 to 760 Torr, and a growth temperature is 100 to 1000° C.

11. The preparation method according to claim 1, comprising: successively forming 1 to 99 of the $\alpha\text{-}(Al_xGa_{1-x})_2O_3$ strain buffering layers on the sapphire substrate.

12. The preparation method according to claim 1, wherein: each of the $\alpha\text{-}(Al_xGa_{1-x})_2O_3$ strain buffering layers has a thickness of 1 to 1000 nm.

13. The preparation method according to claim 1, wherein: at least two of the $\alpha\text{-}(Al_xGa_{1-x})_2O_3$ strain buffering layers contain different amounts of Al element.

14. The preparation method according to claim 1, wherein: for the forming of the gallium oxide epitaxial layers, a growth pressure is 10 to 760 Torr, and a growth temperature is 100 to 600° C.

15. The preparation method according to claim 1, wherein: the gallium oxide epitaxial layers are made of $\alpha\text{-}Ga_2O_3$.

16. A gallium oxide film based on a sapphire substrate, wherein the gallium oxide film is prepared by the preparation method according to claim 1.

17. A gallium oxide film based on a sapphire substrate, comprising a sapphire substrate and a gallium oxide epitaxial layer, wherein: there are more than one $\alpha\text{-}(Al_xGa_{1-x})_2O_3$ strain buffering layers further formed between the sapphire substrate and the gallium oxide epitaxial layers, wherein $0.99 \geq x \geq 0.01$.

18. The gallium oxide film based on the sapphire substrate according to claim 17, wherein: each of the $\alpha\text{-}(Al_xGa_{1-x})_2O_3$ strain buffering layers has a thickness of 1 to 1000 nm.

19. The gallium oxide film based on the sapphire substrate according to claim 17, wherein: the gallium oxide film comprises 1 to 99 of the $\alpha\text{-}(Al_xGa_{1-x})_2O_3$ strain buffering layers.

20. The gallium oxide film based on the sapphire substrate according to claim 17, wherein: at least two of the $\alpha\text{-}(Al_xGa_{1-x})_2O_3$ strain buffering layers contain different amounts of Al element.

21. A method of producing semiconductor power devices or semiconductor photoelectronic devices, comprising the step of using the gallium oxide film based on the sapphire substrate according to claim 17.

* * * * *